(12) United States Patent
Hatakeyama et al.

(10) Patent No.: US 6,541,179 B2
(45) Date of Patent: Apr. 1, 2003

(54) RESIST COMPOSITIONS AND PATTERNING PROCESS

(75) Inventors: Jun Hatakeyama, Nakakubiki-gun (JP); Youichi Ohsawa, Nakakubiki-gun (JP); Tsunehiro Nishi, Nakakubiki-gun (JP); Jun Watanabe, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/811,695

(22) Filed: Mar. 20, 2001

(65) Prior Publication Data

US 2001/0033990 A1 Oct. 25, 2001

(30) Foreign Application Priority Data

Mar. 21, 2000 (JP) ........................................ 2000-077496

(51) Int. Cl.[7] .............................................. G03F 7/004
(52) U.S. Cl. ................... 430/270.1; 430/325; 430/326; 430/921
(58) Field of Search ........................... 430/270.1, 921, 430/325, 326

(56) References Cited

U.S. PATENT DOCUMENTS

| | | | |
|---|---|---|---|
| 4,233,292 A | * 11/1980 | Kathawala | 424/185 |
| 5,585,507 A | 12/1996 | Nakano et al. | |
| 5,635,332 A | 6/1997 | Nakano et al. | |
| 5,691,111 A | 11/1997 | Iwasa et al. | |
| 5,756,850 A | 5/1998 | Iwasa et al. | |
| 5,972,560 A | * 10/1999 | Kaneko et al. | 430/270.1 |
| 6,074,801 A | * 6/2000 | Iwasa et al. | 430/270.1 |
| 6,284,427 B1 | * 9/2001 | Okazaki et al. | 430/270.1 |
| 6,455,228 B1 | * 9/2002 | Tachikawa et al. | 430/273.1 |

FOREIGN PATENT DOCUMENTS

| | | |
|---|---|---|
| JP | 7-25846 | 1/1995 |
| JP | 7-28237 | 1/1995 |
| JP | 8-27102 | 1/1996 |
| JP | 10-319581 | 12/1998 |

OTHER PUBLICATIONS

English Abstract for JP 10–319581.

* cited by examiner

Primary Examiner—Rosemary Ashton
(74) Attorney, Agent, or Firm—Millen, White, Zelano & Branigan, P.C.

(57) ABSTRACT

A resist composition contains a base resin, a photoacid generator, and a solvent. The photoacid generator is a sulfonium salt of formula (1).

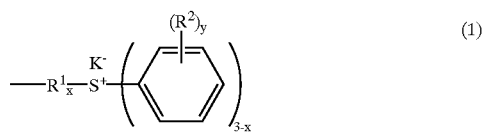

$R^1$ is a monovalent cyclic or bridged ring $C_{3-20}$, hydrocarbon group, $R^2$ is hydroxyl, nitro, halogen, or a straight, branched or cyclic monovalent $C_{1-15}$ hydrocarbon group which may contain O, N, S or halogen atom, $K^-$ is a non-nucleophilic counter ion, x is equal to 1 or 2, and y is an integer of 0–3. The resist composition is sensitive to ArF excimer laser light, has good sensitivity and resolution, and forms a thick film which is advantageous in etching.

18 Claims, No Drawings

RESIST COMPOSITIONS AND PATTERNING PROCESS

This invention relates to a resist composition comprising a specific sulfonium salt as the photoacid generator, for use with radiation having a wavelength of up to 200 nm, especially ArF excimer laser light, $F_2$ excimer laser light, EUV, x-ray and electron beam (EB), and a patterning process using the same.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using an ArF excimer laser as the light source is strongly desired to reach the practical level as the micropatterning technique capable of achieving a feature size of 0.2 μm or less.

In the photolithography using an ArF excimer laser (wavelength 193 nm) as the light source, a high sensitivity resist material capable of achieving a high resolution at a small dose of exposure is needed to prevent the degradation of precise and expensive optical system materials. Among several measures for providing a high sensitivity resist material, the most common is to select each component which is highly transparent at the wavelength of 193 nm. For example, polyacrylic acid and derivatives thereof, norbornenemaleic anhydride alternating copolymers, polynorbornene and metathesis ringopening polymers have been proposed as the base resin. This choice is effective in that the transparency of a resin alone is increased. However, the photoacid generator has the problem that increasing its transparency leads to a drop of acid generation efficiency, resulting in a low sensitivity or the lack of thermal stability and storage stability. There is available no photoacid generator which is practically acceptable.

For example, JP-A 7-25846, JP-A 7-28237 and JP-A 8-27102 disclose alkylsulfonium salts which are highly transparent, but unsatisfactory in acid generation efficiency and thermal stability. JP-A 10-319581 discloses alkylarylsulfonium salts which have a high sensitivity and a good balance of transparency and acid generation efficiency, but lack thermal stability and storage stability. Arylsulfonium salts, which are regarded effective in photolithography using a KrF excimer laser, are good in acid generation efficiency, thermal stability and storage stability, but very low transparent to ArF excimer laser light so that the pattern resulting from exposure and development is noticeably tapered. The lack of transparency can be compensated for by thinning the resist, but such a thin resist film is less resistant to etching. This is inadequate as the pattern forming process.

SUMMARY OF THE INVENTION

An object of the invention is to provide a highly resolvable resist composition comprising a photoacid generator having a high sensitivity to ArF excimer laser light as well as thermal stability and storage stability. Another object is to provide a patterning process using the resist composition.

It has been found that a sulfonium salt of the following general formula (1) has a high sensitivity to ArF excimer laser light as well as satisfactory thermal stability and storage stability and that a resist composition having the sulfonium salt blended therein has a high resolution and is fully suited for precise micropatterning.

The invention provides a resist composition comprising a base resin, a photoacid generator, and a solvent. The photoacid generator is a sulfonium salt of the following general formula (1).

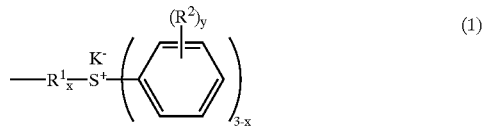

Herein $R^1$ is a monovalent cyclic or bridgedring hydrocarbon group of 3 to 20 carbon atoms, $R^2$ is hydroxyl, nitro, halogen, or a straight, branched or cyclic monovalent hydrocarbon group of 1 to 15 carbon atoms which may contain an oxygen, nitrogen, sulfur or halogen atom, $K^-$ is a non-nucleophilic counter ion, x is equal to 1 or 2, and y is an integer of 0 to 3.

In one preferred embodiment, the base resin is a polymer having an alicyclic structure. The base resin is typically at least one polymer selected from the group consisting of polyacrylic acid and derivative thereof, a ternary or quaternary copolymer of a norbornene derivative-maleic anhydride alternating polymer and polyacrylic acid or derivative thereof, a ternary or quaternary copolymer of a tetracyclododecene derivativemaleic anhydride alternating polymer and polyacrylic acid or derivative thereof, a ternary or quaternary copolymer of a norbornene derivative-maleimide alternating polymer and polyacrylic acid or derivative thereof, a ternary or quaternary copolymer of a tetracyclododecene derivativemaleimide alternating polymer and polyacrylic acid or derivative thereof, polynorbornene, and metathesis ringopened polymer.

In a further preferred embodiment, the base resin is a polymer comprising recurring units of the following general formula (2) and having a weight average molecular weight of 1,000 to 500,000.

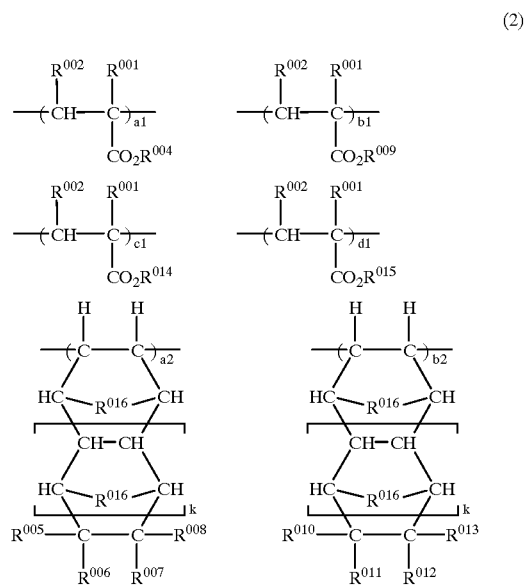

-continued

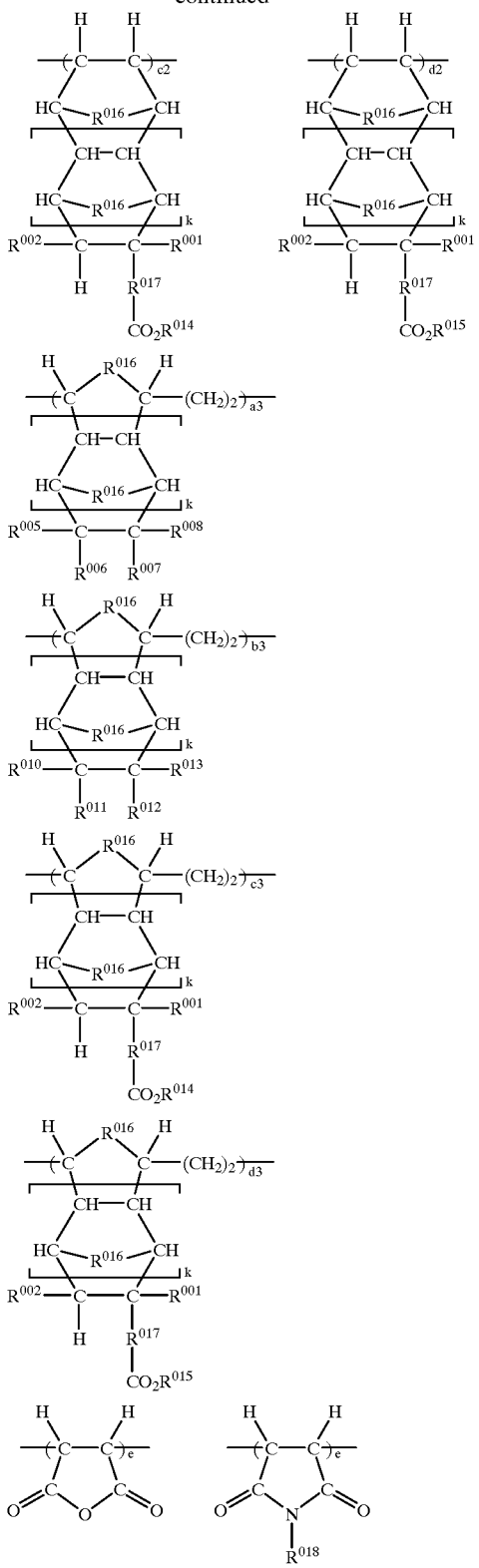

Herein $R^{001}$ is hydrogen, methyl or $CH_2CO_2R^{003}$; $R^{002}$ is hydrogen, methyl or $CO_2R^{003}$; $R^{003}$ is a straight, branched or cyclic alkyl group of 1 to 15 carbon atoms; $R^{004}$ is hydrogen or a monovalent hydrocarbon group of 1 to 15 carbon atoms having a carboxyl or hydroxyl group; at least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group while the remaining R's are independently single bonds or straight, branched or cyclic alkylene groups of 1 to 15 carbon atoms; $R^{009}$ is a monovalent hydrocarbon group of 3 to 15 carbon atoms containing a —$CO_2$— partial structure; at least one of $R^{010}$ to $R^{013}$ is a monovalent hydrocarbon group of 2 to 15 carbon atoms containing a —$CO_2$— partial structure, while the remaining R's are independently hydrogen or straight, branched or cyclic alkyl groups of 1 to 15 carbon atoms, $R^{010}$ to $R^{013}$, taken together, may form a ring, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic alkylene groups of 1 to 15 carbon atoms; $R^{014}$ is a polycyclic hydrocarbon group having 7 to 15 carbon atoms or an alkyl group containing a polycyclic hydrocarbon group; $R^{015}$ is an acid labile group; $R^{016}$ is a methylene group or oxygen atom; $R^{017}$ is a single bond or a straight, branched or cyclic alkylene group of 1 to 10 carbon atoms which may have a hetero atomcontaining substituent; $R^{018}$ is hydrogen or an alkyl group of 1 to 10 carbon atoms; k is equal to 0 or 1; a1, a2, a3, b1, b2, b3, c1, c2, c3, d1, d2, d3, and e are numbers from 0 to less than 1, satisfying a1+a2+a3+b1+b2+b3+c1+c2+c3+d1+d2+d3+e=1.

In another aspect, the invention provides a chemically amplified, positive resist composition comprising a photoacid generator of the general formula (1); a base resin as defined above which is substantially insoluble in a developer, but becomes soluble in the developer under the action of an acid; and a solvent. Preferably, the resist composition further includes a basic compound.

In a further aspect, the invention provides a chemically amplified, negative resist composition comprising a photoacid generator of the general formula (1); a crosslinker; a base resin as defined above which is soluble in a developer, but becomes insoluble in the developer after being crosslinked with the crosslinker under the action of an acid; and a solvent. Preferably, the negative resist composition further includes a basic compound.

In a still further aspect, the invention provides a process for forming a resist pattern comprising the steps of applying a resist composition as defined above onto a substrate to form a coating; heat treating the coating and then exposing it to radiation having a wavelength of up to 200 nm through a photo mask; and optionally heat treating the exposed coating and developing it with a developer.

The sulfonium salt of the formula (1) has a very high sensitivity to ArF excimer laser light so that even when blended in a small amount, it can generate a sufficient amount of acid. Then a resist composition having the sulfonium salt blended therein has a high sensitivity and high transparency, forms a pattern having high rectangularity following exposure and development, and is advantageous in etching because of no need for film thinning. The inventive sulfonium salt eliminates the lack of thermal stability and storage stability which is the drawback of prior art alkylsulfonium salts and alkylarylsulfonium salts.

In the sulfonium salt of the formula (1), one or two aryl groups are introduced at the sacrifice of transparency to some extent. However, the introduction of aryl group(s)

improves acid generation efficiency outstandingly and as a consequence, enables to enhance sensitivity. When the sensitivity to light of 193 nm wavelength is compared between resist films having the same transmittance, the sulfonium salt of formula (1) improves the sensitivity by a factor of at least 3 over the arylsulfonium salts. The problem of thermal stability and storage stability that the prior art salts suffer from has been overcome by selecting cyclic alkyl groups.

It is noted that the sulfonium salt of formula (1) is highly sensitive to radiation with a wavelength of less than 200 nm, especially ArF excimer laser light, and not useful in photolithography using KrF excimer laser light of 248 nm wavelength.

DESCRIPTION OF THE PREFERRED EMBODIMENT

Sulfonium salt

The resist composition of the invention contains a sulfonium salt of the general formula (1).

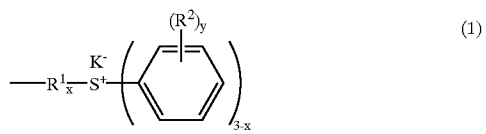

Herein $R^1$ is a monovalent cyclic hydrocarbon group of 3 to 20 carbon atoms which may be a bridged ring hydrocarbon group; $R^2$ is a hydroxyl group, nitro group, halogen atom, or straight, branched or cyclic monovalent hydrocarbon group of 1 to 15 carbon atoms which may contain an oxygen, nitrogen, sulfur or halogen atom; $K^-$ is a nonnucleophilic counter ion; x is equal to 1 or 2, and y is an integer of 0 to 3.

More particularly, $R^1$ stands for monovalent cyclic hydrocarbon groups of 3 to 20 carbon atoms, for example, cyclopropyl, cyclobutyl, cyclopentyl, cyclohexyl, norbornyl, and adamantyl. $R^2$ stands for hydroxyl groups, nitro groups, halogen atoms, or straight, branched or cyclic monovalent hydrocarbon groups of 1 to 15 carbon atoms which may contain O, N, S or a halogen atom, for example, alkyl groups such as methyl, ethyl, tert-butyl, and cyclohexyl. Some hydrogen atoms on these groups may be replaced by groups containing an O, N or S atom, such as hydroxyl, oxo, nitro or mercapto groups. $K^-$ is a nonnucleophilic counter ion, for example, halide ions such as chloride ion and bromide ion, triflate, fluoroalkylsulfonates such as 1,1,1-trifluoroethanesulfonate and nonafluorobutanesulfonate, arylsulfonates such as tosylate, benzenesulfonate, 4-fluorobenzenesulfonate, and 1,2,3,4,5-pentafluorobenzenesulfonate, and alkylsulfonates such as mesylate and butanesulfonate. Letter x is an integer of 1 or 2, and y is an integer of 0 to 3, preferably equal to 0, 1 or 2, and more preferably equal to 0 or 1.

Illustrative, nonlimiting, examples of the sulfonium salt of formula (1) which is formulated in the resist composition according to the invention are given below.

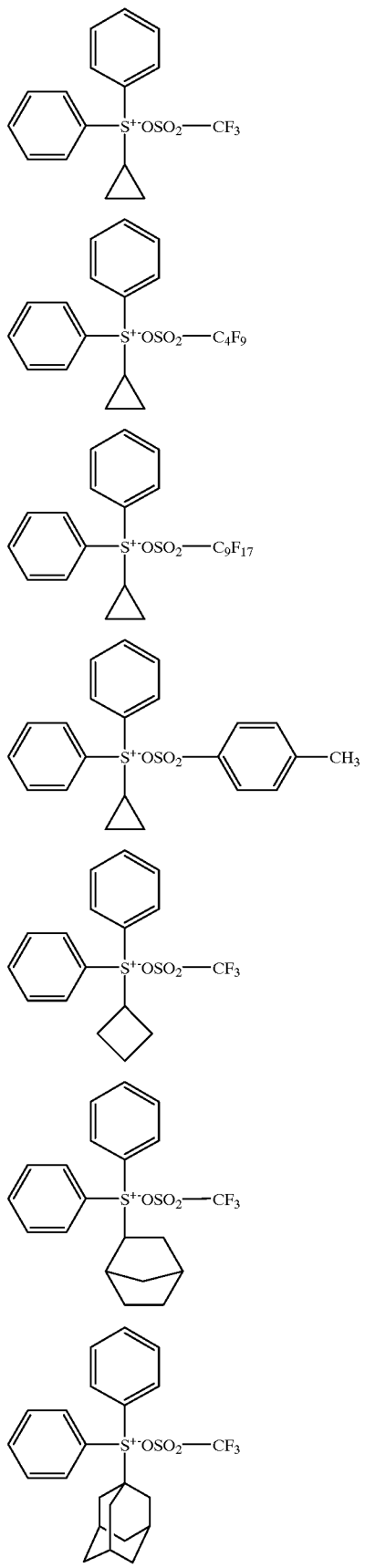

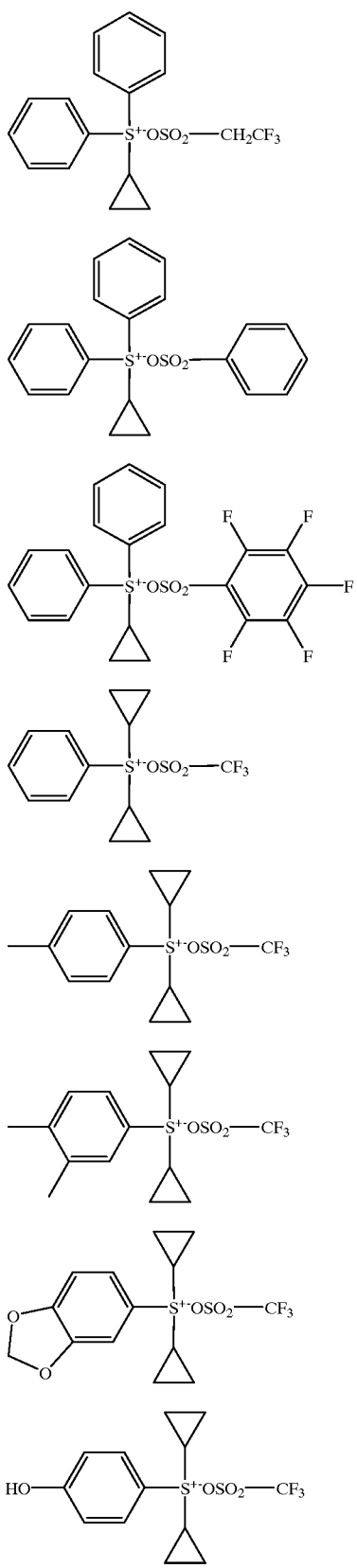

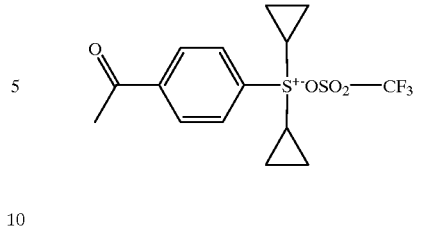

In the resist composition according to the invention, the sulfonium salt of formula (1) is preferably formulated in an amount of about 0.1 to 15 parts, especially about 0.5 to 8 parts by weight per 100 parts by weight of the base resin (all parts are by weight, hereinafter). Less amounts of the sulfonium salt may lead to low sensitivity. Excessive amounts of the sulfonium salt may detract from transparency, resulting in a resist composition with an inferior resolving power.

In one preferred embodiment, the resist composition uses as the base resin a polymer or high molecular weight compound comprising recurring units of the following general formula (2) and having a weight average molecular weight of about 1,000 to 500,000, especially about 5,000 to 100,000.

(2)

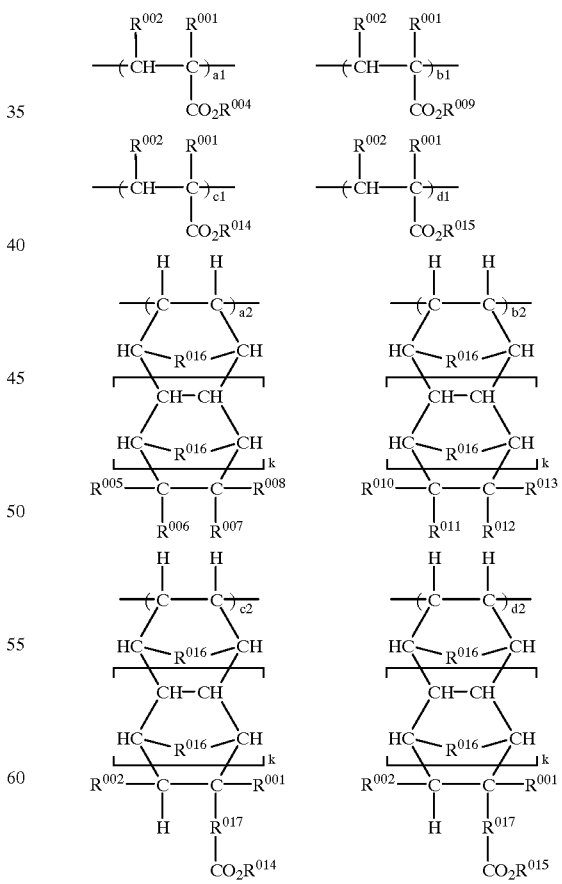

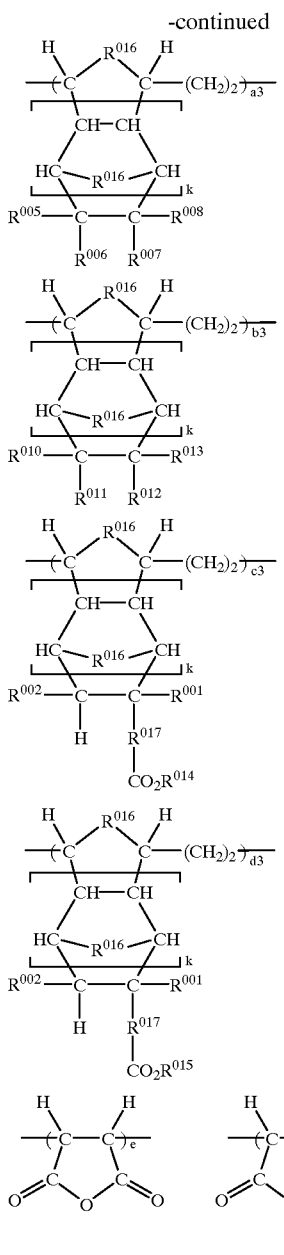

Herein, $R^{001}$ is hydrogen, methyl or $CH_2CO_2R^{003}$.

$R^{002}$ is hydrogen, methyl or $CO_2R^{003}$.

$R^{003}$ is a straight, branched or cyclic alkyl group of 1 to 15 carbon atoms, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group (preferably straight, branched or cyclic alkyl group) of 1 to 15 carbon atoms having a carboxyl or hydroxyl group, for example, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

At least one of $R^{005}$ to $R^{008}$ represents a monovalent hydrocarbon group (preferably straight, branched or cyclic alkyl group) of 1 to 15 carbon atoms having a carboxyl or hydroxyl group while the remaining R's independently represent hydrogen or a straight, branched or cyclic alkyl group of 1 to 15 carbon atoms. Examples of the carboxyl or hydroxylbearing monovalent hydrocarbon group of 1 to 15 carbon atoms include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxy ethoxycarbonyl, 4-hydroxybutoxycarbonyl, carboxycyclopentyl oxycarbonyl, carboxycyclohexyloxycarbonyl, carboxynorbornyl oxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the straight, branched or cyclic alkyl group of 1 to 15 carbon atoms are the same as exemplified for $R^{003}$.

Alternatively, $R^{005}$ to $R^{008}$, taken together, may form a ring, and in that event, at least one of $R^{005}$ to $R^{008}$ is a divalent hydrocarbon group (preferably straight or branched alkylene group) of 1 to 15 carbon atoms having a carboxyl or hydroxyl group, while the remaining R's are independently single bonds or straight, branched or cyclic alkylene groups of 1 to 15 carbon atoms. Examples of the carboxyl or hydroxyl-bearing divalent hydrocarbon group of 1 to 15 carbon atoms include the groups exemplified as the carboxyl or hydroxyl-bearing monovalent hydrocarbon group, with one hydrogen atom eliminated therefrom. Examples of the straight, branched or cyclic alkylene groups of 1 to 15 carbon atoms include the groups exemplified for $R^{003}$, with one hydrogen atom eliminated therefrom.

$R^{009}$ is a monovalent hydrocarbon group of 3 to 15 carbon atoms containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2oxooxolan-5-yl.

At least one of $R^{010}$ to $R^{013}$ is a monovalent hydrocarbon group of 2 to 15 carbon atoms containing a —$CO_2$— partial structure, while the remaining R's are independently hydrogen or straight, branched or cyclic alkyl groups of 1 to 15 carbon atoms. Examples of the monovalent hydrocarbon group of 2 to 15 carbon atoms containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic alkyl groups of 1 to 15 carbon atoms are the same as exemplified for $R^{003}$.

$R^{010}$ to $R^{013}$, taken together, may form a ring, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic alkylene groups of 1 to 15 carbon atoms. Examples of the divalent hydrocarbon group of 1 to 15 carbon atoms containing a—$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic alkylene groups of 1 to 15 carbon atoms include the groups exemplified for $R^{003}$, with one hydrogen atom eliminated therefrom.

$R^{014}$ is a polycyclic hydrocarbon group having 7 to 15 carbon atoms or an alkyl group containing a polycyclic hydrocarbon group, for example, norbornyl, bicyclo[3.3.1]-nonyl, tricyclo[5.2.1.0]decyl, adamantyl, ethyladamantyl, butyladamantyl, norbornylmethyl, and adamantylmethyl.

$R^{015}$ is an acid labile group.

$R^{016}$ is a methylene group or oxygen atom.

$R^{017}$ is a single bond or a straight, branched or cyclic alkylene group of 1 to 10 carbon atoms which may have a hetero atom-containing substituent such as hydroxy, alkoxy or acetyl.

$R^{018}$ is hydrogen or an alkyl group of 1 to 10 carbon atoms.

Letter k is equal to 0 or 1; a1, a2, a3, b1, b2, b3, c1, c2, c3, d1, d2, d3, and e are numbers from 0 to less than 1, satisfying a1+a2+a3+b1+b2+b3+c1+c2+c3+d1+d2+d3+e=1.

Illustrative examples of the acid labile group represented by $R^{015}$ include groups of the following formulae (L1) to (L5), tertiary alkyl groups of 4 to 20 carbon atoms, preferably 4 to 15 carbon atoms, trialkylsilyl groups whose alkyls each have 1 to 6 carbon atoms, and oxoalkyl groups of 4 to 20 carbon atoms.

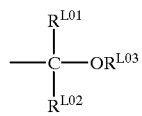
(L1)

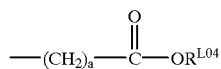
(L2)

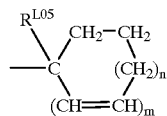
(L3)

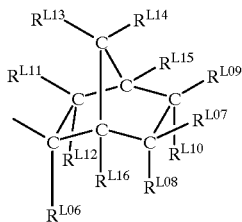
(L4)

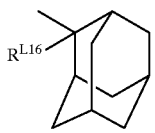
(L5)

Herein, $R^{L01}$ and $R^{L02}$ each are hydrogen or a straight, branched or cyclic alkyl group of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may have a hetero atom such as an oxygen atom, for example, straight, branched or cyclic alkyl groups, in which some hydrogen atoms may be replaced by hydroxyl, alkoxy, oxo, amino, or alkylamino groups. More illustrative of the $R^{L03}$ group are the substituted alkyl groups shown below.

—(CH$_2$)$_4$—OH  —(CH$_2$)$_2$—O—(CH$_{23}$—CH$_3$

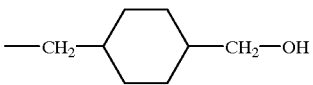

—(CH$_2$)$_2$—O—(CH$_2$)$_2$—OH  —(CH$_2$)$_6$—OH

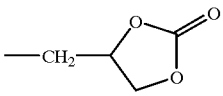

A pair of $R^{L01}$ ad $R^{L02}$, a pair of $R^{L01}$ and $R^{L03}$, or a pair of $R^{L02}$ and $R^{L03}$, taken together, may form a ring. $R^{L01}$, $R^{L02}$ and $R^{L03}$ each represent straight or branched alkylene groups of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, trialkylsilyl group whose alkyls each have 1 to 6 carbon atoms, oxoalkyl group of 4 to 20 carbon atoms, or group of above formula (L1). Exemplary tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl and dimethyl-sect-butylsilyl. Examples of oxoalkyl groups include 3-oxocyclohexyl, 4-methyl-2-oxooxan-4-yl, and 5-methyl-5-oxooxolan-4-yl. The letter "a" is an integer of 0 to 6.

$R^{L05}$ is a straight, branched or cyclic alkyl group of 1 to 8 carbon atoms or substituted or unsubstituted aryl group of 6 to 20 carbon atoms. Exemplary straight, branched or cyclic alkyl groups include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl, and cyclohexylethyl. Exemplary substituted or unsubstituted aryl groups include phenyl, methylphenyl, naphthyl, anthryl, phenanthryl, and pyrenyl. The letter m is equal to 0 or 1, and n is equal to 0, 1, 2, or 3, satisfying 2m+n=2 or 3.

$R^{L06}$ is a straight, branched or cyclic $C_{1-8}$ alkyl group or a substituted or unsubstituted $C_{6-20}$ aryl group. Examples of these groups are as exemplified for $R^{L05}$.

$R^{L07}$ to $R^{L06}$ are independently hydrogen or $C_{1-15}$ monovalent hydrocarbon groups which may contain a hetero atom. Examples of the hydrocarbon groups include straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl; and substituted groups in which some of the hydrogen atoms on the foregoing groups are replaced by hydroxyl, alkoxy, carboxyl, alkoxycarbonyl, oxo, amino, alkylamino, cyano, mercapto, alkylthio and sulfo groups. Any pair of $R^{L07}$ to $R^{L16}$ (e.g., a pair of $R^{L07}$ and $R^{L08}$, a pair of $R^{L07}$ and $R^{L09}$, a pair of $R^{L08}$ and $R^{L10}$, a pair of $R^{L09}$ and $R^{L10}$, a pair of $R^{L11}$ and $R^{L12}$, and a pair of $R^{L13}$ and $R^{L14}$) may form a ring. When these R's in pair form a ring, they are independently divalent $C_{1-15}$ hydrocarbon groups which may contain a hetero atom, examples of which are the same as exemplified above for the monovalent hydrocarbon groups, with one hydrogen atom eliminated therefrom. Also any pair of $R^{L07}$ to $R^{L16}$ (e.g., a pair of $R^{L07}$ and $R^{L09}$, a pair of $R^{L09}$ and $R^{L15}$, and a pair of $R^{L13}$ and $R^{L15}$) may form a single bond so that a double bond is formed between the carbon and the carbon to which these R's are attached.

Of the acid labile groups of formula (L1), straight and branched groups are illustrated below.

—CH$_2$—O—CH$_3$  —CH$_2$—O—CH$_2$—CH$_3$  —CH$_2$—O—(CH$_2$)$_2$—CH$_3$

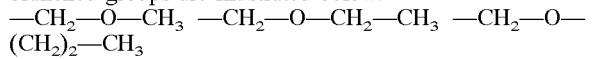

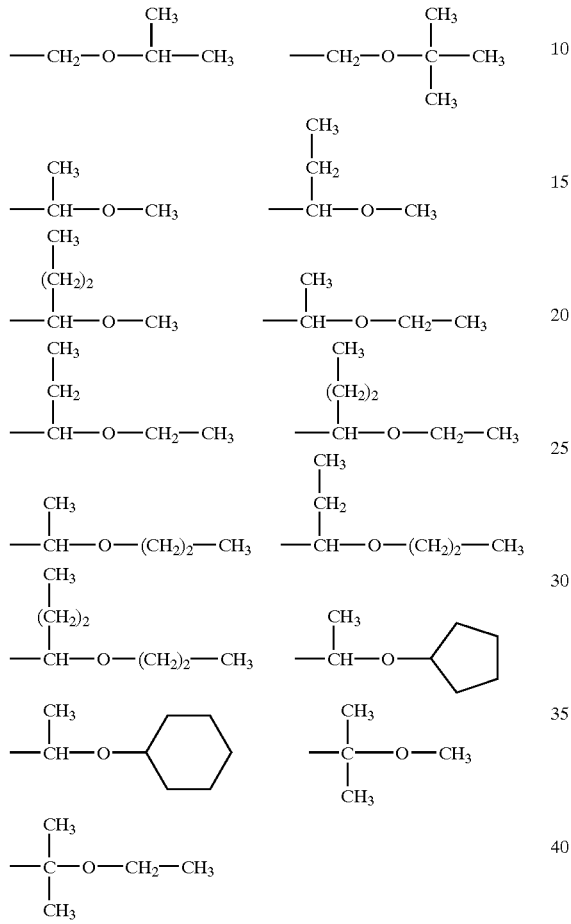

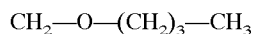

CH$_2$—O—(CH$_2$)$_3$—CH$_3$

Of the acid labile groups of formula (L1), exemplary cyclic groups include tetrahydrofuran-2-yl, 2-methyltetrahydrofuran-2-yl, tetrahydropyran-2-yl and 2-methyltetrahydropyran-2-yl.

Illustrative examples of the acid labile group of formula (L2) include tert-butoxycarbonyl, tert-butoxycarbonylmethyl, tert-amyloxycarbonyl, tert-amyloxycarbonyl-methyl, 1,1-diethylpropyloxycarbonyl, 1,1-diethylpropyloxy carbonylmethyl, 1-ethylcyclopentyloxycarbonyl, 1-ethyl-cyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Illustrative examples of the acid labile group of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Illustrative examples of the acid labile group of formula (L4) are given below.

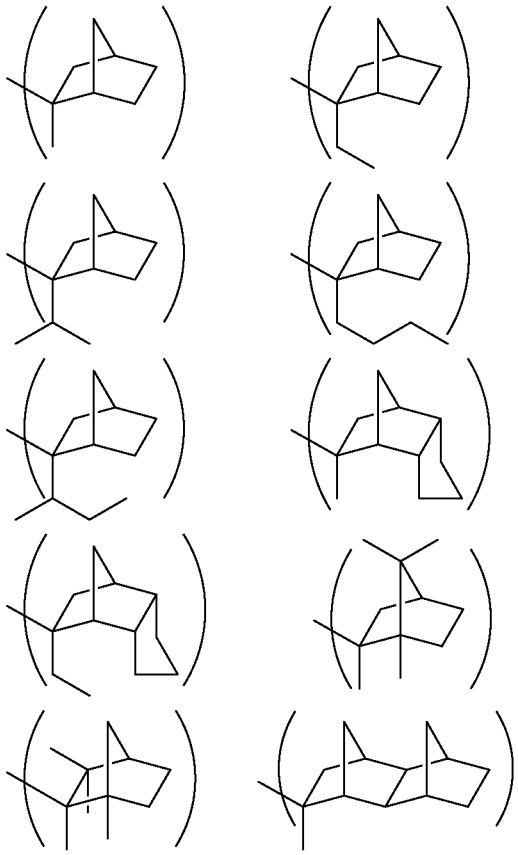

Examples of the tertiary alkyl, trialkylsilyl and oxoalkyl groups included in the acid labile group represented by $R^{015}$ are the same as exemplified above.

Illustrative examples of the acid labile group of formula (L5) are given below.

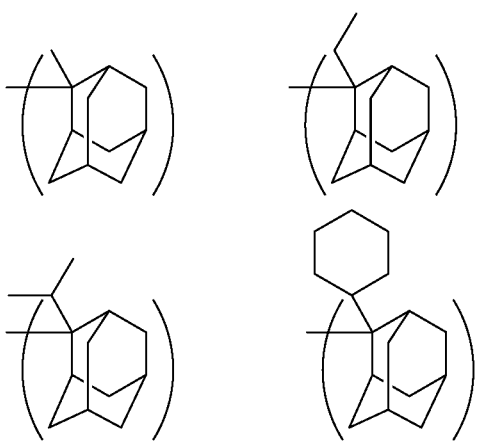

The polymer formulated in the inventive resist composition has a weight average molecular weight of about 1,000 to 500,000, preferably about 3,000 to 100,000. Outside the range, the etching resistance may become extremely low and the resolution may become low because a substantial difference in rate of dissolution before and after exposure is lost.

The polymer is not limited to one type and a mixture of two or more polymers may be added. The use of plural polymers allows for easy adjustment of resist properties.

In the resist composition of the invention, a compound other than the sulfonium salt of formula (1) may be formulated as the photoacid generator.

Photoacid generator

The additional photoacid generator which can be used herein includes the following:
(i) onium salts of the formula (P1a1), (P1a2) or (P1b),
(ii) diazomethane derivatives of the formula (P2),
(iii) glyoxime derivatives of the formula (P3),
(iv) bissulfone derivatives of the formula (P4),
(v) sulfonic acid esters of Nhydroxyimide compounds of the formula (P5),
(vi) Pketosulfonic acid derivatives,
(vii) disulfone derivatives,
(viii) nitrobenzylsulfonate derivatives, and
(ix) sulfonate derivatives.

These photoacid generators are described in detail.
(i) Onium salts of formula (P1a1), (P1a2) or (P1b):

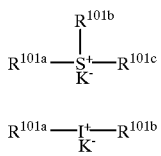

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a nonnucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-sect-butoxyphenyl, and m-sect-butoxyphenyl; alkylphenyl groups such as 2-methylphenyl, 3-methylphenyl, 4-methylphenyl, ethylphenyl, 4-sect-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the nonnucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

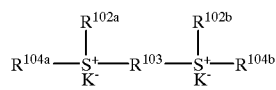

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a1) and (P1a2).

(ii) Diazomethane derivatives of formula (P2)

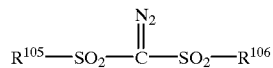

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-sect-butoxyphenyl, and m-sect-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime derivatives of formula (P3)

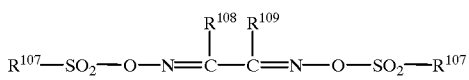

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$ Examples of the alkylene groups represented by $R^{108}$ and $R^{109}$ include methylene, ethylene, propylene, butylene, and hexylene.

(iv) Bissulfone derivatives of formula (P4)

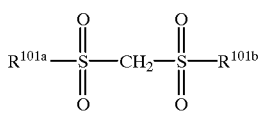

Herein, $R^{101a}$ and $R^{101b}$ are as defined above.

(v) Sulfonic acid esters of N-hydroxyimide compounds of formula (P5)

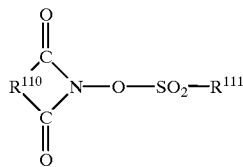

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), heteroaromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, 1,2-ethylene, 1,3-propylene, 1,4-butylene, 1-phenyl-1,2-ethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and sect-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-sect-butoxyphenyl, p-acetylphenyl and p-nitrophenyl; the hetero-aromatic groups of 3 to 5 carbon atoms include pyridyl and furyl.

Illustrative examples of the photoacid generator include:

onium salts such as diphenyliodonium trifluoromethanesulfonate, (p-sect-butoxyphenyl)phenyliodonium trifluoromethanesulfonate, diphenyliodonium p-toluenesulfonate, (p-sect-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-sect-butoxyphenyl)phenylsulfonium trifluoromethanesulfonate, tris(p-sect-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-sect-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-oluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclo hexyl)sulfonium trifluoromethanesulfonate, ethylenebis [methyl(2-oxocyclopentyl)sulfonium trifluoromethane sulfonate], and 1,2'-naphthylcarbonylmethyltetrahydro 5 -thiophenium triflate;

diazomethane derivatives such as bis(benzenesulfonyl)diazomethane, bis(ptoluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyll(tert-butylsulfonyl)diazomethane, 1-cyclohexylsulfonyl-1(tert-amylsulfonyl)diazomethane, and 1-tert-amylsulfonyl-1-(tert-butylsulfonyl)diazomethane;

glyoxime derivatives such as biso(p-toluene-sulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3- pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butane-sulfonyl)-2,3-pentanedioneglyoxime, bis-o-(n-butane-sulfonyl)-2-methyl-3,4-pentanedioneglyoxime, bis-o-(methanesulfonyl)-α-dimethylglyoxime, bis-o-(trifluoro-methanesulfonyl)-α-dimethylglyoxime, bis-o-(1,1,1-trifluoroethanesulfonyl)-α-dimethylglyoxime, bis-o-(tertbutanesulfonyl)-α-dimethylglyoxime, bis-o-(perfluorooctanesulfonyl)-α-dimethylglyoxime, bis-o-(cyclohexane-sulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonyl methane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide-2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthyl carbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis—o—(p-toluenesulfonyl)α-dimethylglyoxime and bis-o-(n-butanesulfonyl)α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxy succinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The amount of the photoacid generator and the sulfonium salt of formula (1) combined is preferably about 0.1 to 15 parts, and especially about 0.5 to 8 parts by weight, per 100 parts by weight of the base resin. Less than 0.1 part of the photoacid generator would provide a poor sensitivity whereas more than 15 parts of the photoacid generator would lower the transparency and resolution of resist compositions.

Organic solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tertbutyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether and 1-ethoxy-2-propanol because the photoacid generator serving as one of the resist components is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Dissolution regulator

A dissolution regulator may be added to the resist composition. Typical dissolution regulators are compounds having an average molecular weight within a range of 100 to 1,000, and preferably 150 to 800, and bearing on the molecule at least two phenolic hydroxyl groups in which 0 to 100 mol %, on the average, of the hydrogen atoms of the phenolic hydroxyl groups are substituted with acid labile groups, and compounds having a similar average molecular weight and bearing on the molecule at least one carboxyl group in which 80 to 100 mol %, on the average, of the hydrogen atoms of the carboxyl groups are substituted with acid labile groups.

It is noted that the percent substitution of hydrogen atoms of phenolic hydroxyl groups or carboxyl groups with acid labile groups is, on the average, at least 0 mol %, preferably at least 30 mol %, based on the entire phenolic hydroxyl groups or carboxyl groups, with the upper limit of percent substitution being 100 mol %, preferably 80 mol %.

Preferable examples of such compounds having two or more phenolic hydroxyl groups or compounds having one or more carboxyl groups include those of formulas (D1) to (D14) below.

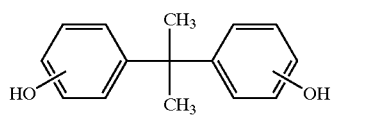

D1

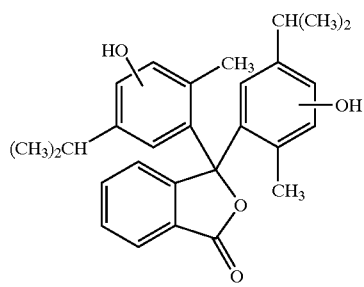

D2

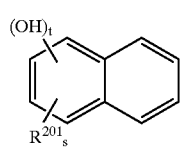

D3

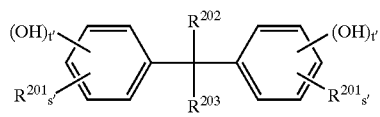

D4

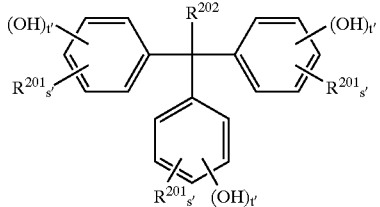

D5

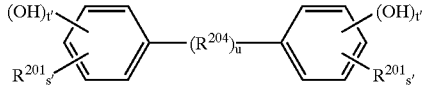

D6

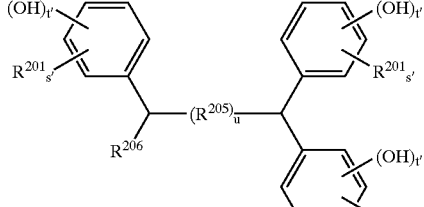

D7

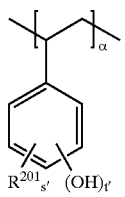

D8

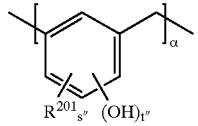

D9

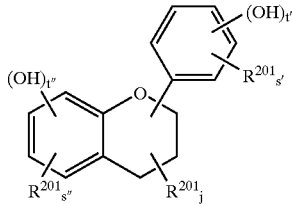

D10

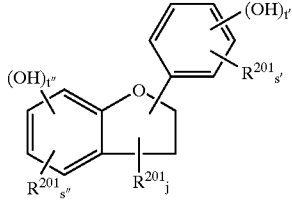

D11

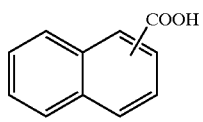

D12

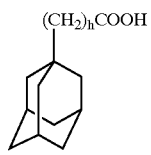

D13

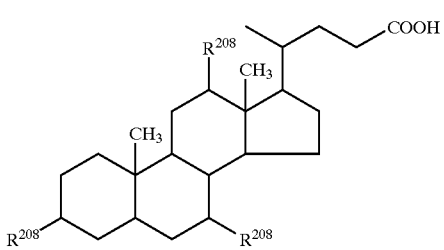

(D14)

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or $-(R^{207})_h$—COOH; $R^{204}$ is $-(CH_2)_i$- (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) may have a molecular weight of 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —CH$_2$COOH; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxylsubstituted phenyl or naphthyl.

Exemplary acid labile groups on the dissolution regulator include groups of the following general formulae (L1) to (L5), tertiary alkyl groups of 4 to 20 carbon atoms, trialkylsilyl groups in which each of the alkyls has 1 to 6 carbon atoms, and oxoalkyl groups of 4 to 20 carbon atoms.

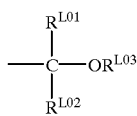

(L1)

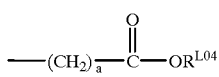

(L2)

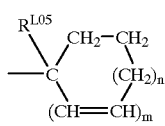

(L3)

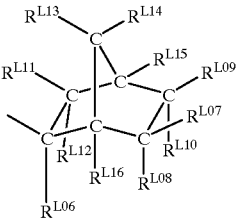

(L4)

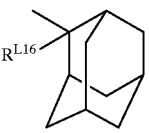

(L5)

Herein, $R^{L01}$ to $R^{L16}$, a, m and n are as defined and exemplified above.

The dissolution regulator may be formulated in an amount of 0 to about 50 parts, preferably about 5 to 50 parts, and more preferably about 10 to 30 parts by weight, per 100 parts by weight of the base resin, and may be used singly or as a mixture of two or more thereof. Less than 5 parts of the dissolution regulator may fail to yield an improved resolution, whereas the use of more than 50 parts would lead to thinning of the patterned film, and thus a decline in resolution.

The dissolution regulator can be synthesized by introducing acid labile groups into a compound having phenolic hydroxyl or carboxyl groups in accordance with an organic chemical formulation.

Basic compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl groupbearing nitrogenous compounds, sulfonyl groupbearing nitrogenous compounds, hydroxyl groupbearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-in-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethyl methylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethyl ethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4tertbutylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1-Hindazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl groupbearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino1-propanol, 4-amino-1-butanol, 4-(2-hydroxyethyl)morpholine, 2-(2-hydroxyethyl)pyridine, 1-(2-hydroxyethyl)piperazine, 1-[-2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (B1) and (B2) may also be included.

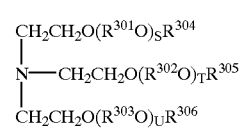

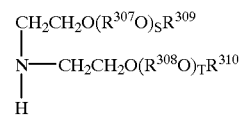

In the formulas, $R^{301}$, $R^{302}$, $R^{303}$, $R^{307}$ and $R^{308}$ independently straight, branched or cyclic alkylenes of 1 to 20 carbon atoms; $R^{304}$, $R^{305}$, $R^{306}$, $R^{309}$ and $R^{310}$ are hydrogen, alkyls of 1 to 20 carbon atoms, or amino; $R^{304}$ and $R^{305}$, $R^{304}$ and $R^{306}$, $R^{305}$ and $R^{307}$, $R^{304}$ with $R^{305}$ and $R^{306}$, and $R^{309}$ and $R^{310}$ may bond together to form rings; and S, T and U are each integers from 0 to 20, with the proviso that hydrogen is excluded from $R^{304}$, $R^{305}$, $R^{306}$, $R^{309}$ and $R^{310}$ when S, T and U are equal to 0.

The alkylene groups represented by $R^{301}$, $R^{302}$, $R^{303}$, $R^{307}$ and $R^{308}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{304}$, $R^{305}$, $R^{306}$, $R^{309}$ and $R^{310}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert butyl, n-pentyl, isopentyl, hexyl, nonyl, decyl, dodecyl, tridecyl, cyclopentyl, and cyclohexyl.

Where $R^{304}$ and $R^{305}$, $R^{304}$ and $R^{306}$, $R^{305}$ and $R^{306}$, $R^{304}$ with $R^{305}$ and $R^{306}$, and $R^{309}$ and $R^{310}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (B1) and (B2) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris(2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown4,1-aza-15-crown-5, and 1-aza-18-crown6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown5.

The basic compound is preferably formulated in an amount of 0.001 to 10 parts, and especially 0.01 to 1 part, per part of the photoacid generator. Less than 0.001 part of the basic compound fails to achieve the desired effects thereof, while the use of more than 10 parts would result in too low a sensitivity and resolution.

Crosslinker

Formulated in the negative resist composition is an acid crosslinker which forms a crosslinked structure under the action of acid. Typical crosslinkers are compounds having at least two hydroxymethyl, alkoxymethyl, epoxy or vinyl ether groups within a molecule. Substituted glycoluril derivatives, urea derivatives, and hexa(methoxymethyl) melamine compounds are suitable as the acid crosslinker in the chemically amplified, negative resist composition. Examples include N,N,N',N'-tetramethoxymethylurea, hexamethylmelamine, tetraalkoxymethyl substituted glycoluril compounds such as tetrahydroxymethyl substituted glycoluril and tetramethoxymethylglycoluril, and condensates of phenolic compounds such as substituted or unsubstituted bis(hydroxymethylphenol) compounds and bisphenol A with epichlorohydrin. Especially preferred crosslinkers are 1,3,5,7-tetraalkoxymethylglycolurils such as 1,3,5,7-tetramethoxymethylglycoluril, 1,3,5,7-tetrahydroxymethylglycoluril, 2,6-dihydroxymethylpcresol, 2,6-dihydroxymethylphenol, 2,2',6,6'-tetrahydroxymethylbisphenol A, 1,4-bis[2-(2-hydroxypropyl)]benzene, N,N,N',N'-tetramethoxymethylurea, and hexamethoxymethylmelamine. In the resist composition, an appropriate amount of the crosslinker is about 1 to 25 parts, and especially about 5 to 20 parts by weight per 100 parts by weight of the solids in the composition. The crosslinkers may be used alone or in admixture of two or more.

Other components

In the resist composition, a compound bearing a ≡C—COOH group in a molecule may be blended. Exemplary, non limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —$R^{401}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

A1

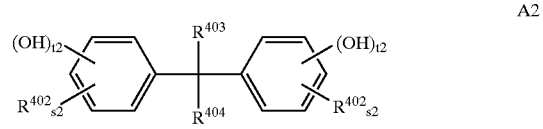

A2

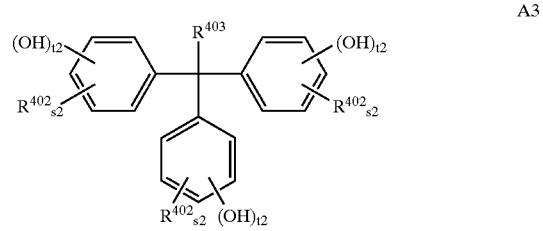

A3

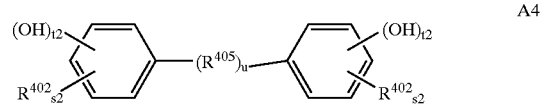

A4

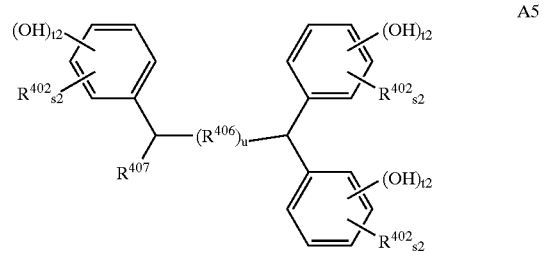

A5

A6

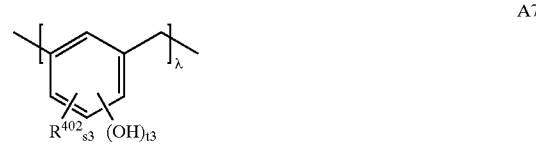

A7

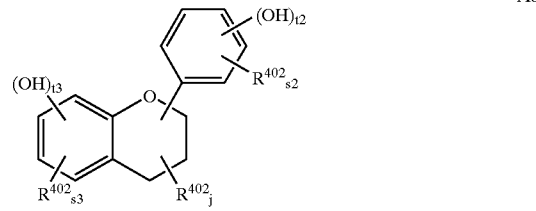

A8

-continued

A9
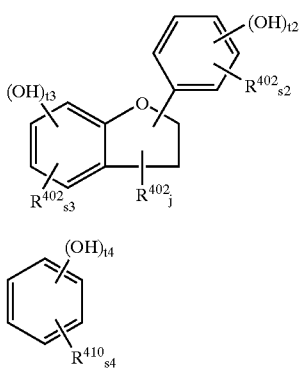

A10
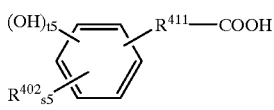

In these formulas, $R^{408}$ is hydrogen or methyl; $R^{402}$ and $R^{403}$ are each hydrogen or a straight or branched alkyl or alkenyl of 1 to 8 carbon atoms; $R^{404}$ is hydrogen, a straight or branched alkyl or alkenyl of 1 to 8 carbon atoms, or a -$(R^{409})_h$—COOR' group (R' being hydrogen or —$R^{409}$—COOH); $R^{405}$ is -$(CH_2)_i$- (wherein i is 2 to 10), an arylene of 6 to 10 carbon atoms, carbonyl, sulfonyl, an oxygen atom, or a sulfur atom; $R^{406}$ is an alkylene of 1 to 10 carbon atoms, an arylene of 6 to 10 carbon atoms, carbonyl, sulfonyl, an oxygen atom, or a sulfur atom; $R^{407}$ is hydrogen, a straight or branched alkyl or alkenyl of 1 to 8 carbon atoms, or a hydroxyl-substituted phenyl or naphthyl; $R^{409}$ is a straight or branched alkylene of 1 to 10 carbon atoms; $R^{410}$ is hydrogen, a straight or branched alkyl or alkenyl of 1 to 8 carbon atoms, or a—$R^{411}$—COOH group; $R^{411}$ is a straight or branched alkylene of 1 to 10 carbon atoms; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

A11
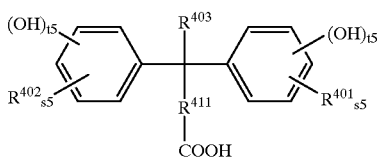

A12
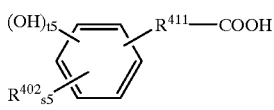

A13
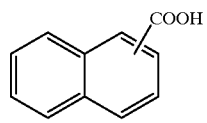

-continued

A14
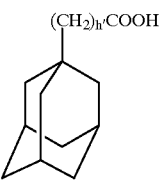

A15
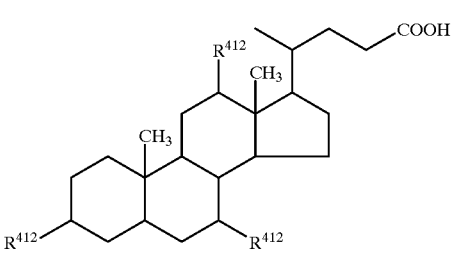

In these formulas, $R^{402}$, $R^{403}$, and $R^{411}$ are as defined above; $R^{412}$ is hydrogen or hydroxyl; s5 and t5 are numbers which satisfy s5 ≧0, t5 ≧0, and s5+t5=5; and h' is equal to 0 or 1.

Illustrative, nonlimiting examples of the compound bearing a ≡C—COOH group include compounds of the general formulas AI-1 to AI-14 and AII-1 to AII-10 below.

AI-1
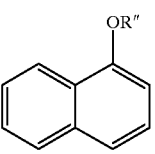

AI-2
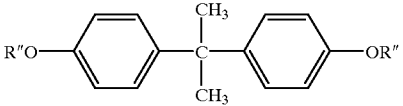

AI-3
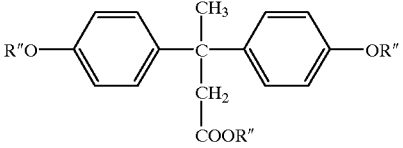

AI-4
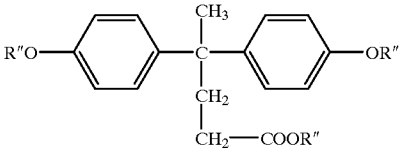

AI-5
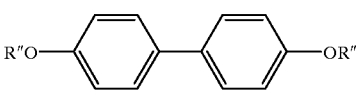

AI-6
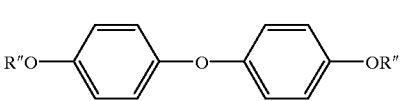

-continued
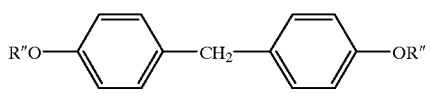
AI-7
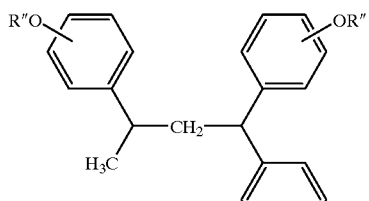
AI-8
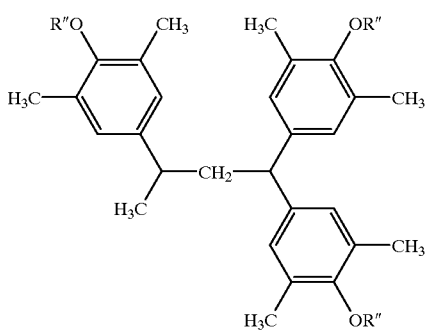
AI-9
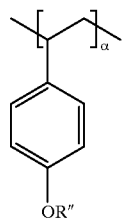
AI-10
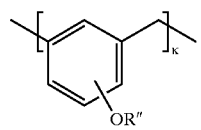
AI-11
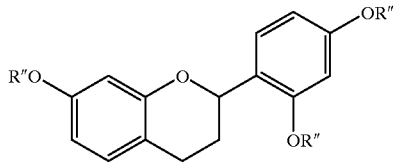
AI-12
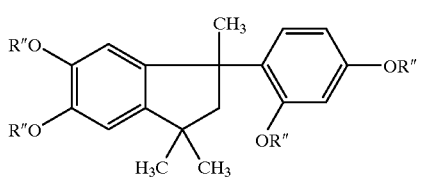
AI-13
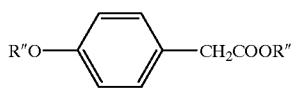
AI-14
In the above formulas, R" is hydrogen or a CH₂COOH group such that the CH₂COOH group accounts for 10 to 100 mol % of R" in each compound, α and κ are as defined above.
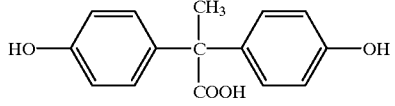
AII-1
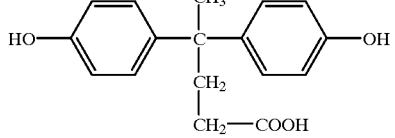
AII-2
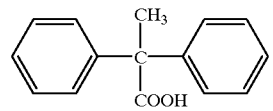
AII-3
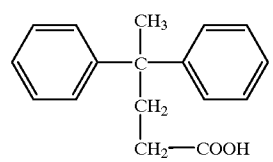
AII-4
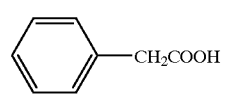
AII-5
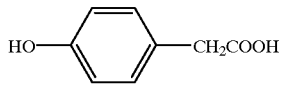
AII-6
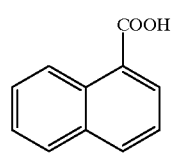
AII-7
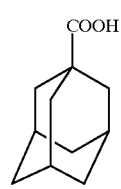
AII-8
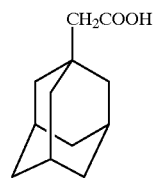
AII-9

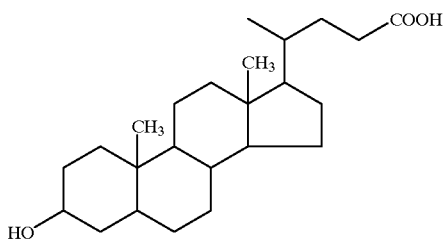

AII-10

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The resist composition of the invention may additionally include an acetylene alcohol derivative for the purpose of suppressing formation of micro-bubbles in the resist solution. Preferred acetylene alcohol derivatives are those having the general formula (S1) or (S2) below.

$$R^{501}-C\equiv C-\underset{\underset{O-(CH_2CH_2O)_YH}{|}}{\overset{\overset{R^{502}}{|}}{C}}-R^{503} \quad \text{S1}$$

$$R^{505}-\underset{\underset{H(OCH_2CH_2)_X-O}{|}}{\overset{\overset{R^{504}}{|}}{C}}-C\equiv C-\underset{\underset{O-(CH_2CH_2O)_YH}{|}}{\overset{\overset{R^{502}}{|}}{C}}-R^{503} \quad \text{S2}$$

In the formulas, $R^{501}$, $R^{502}$, $R^{503}$, $R^{504}$ and $R^{505}$ are each hydrogen or a straight, branched, or cyclic alkyl of 1 to 8 carbon atoms; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and suppressing micro bubbles, whereas more than 2% by weight would result in a resist having a low resolution.

The resist composition of the invention may include, as an optional ingredient, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Florade FC-430 and FC-431 from Sumitomo 3M K.K., Surflon S-141 and S-145 from Asahi Glass K.K., Unidine DS-401, DS-403 and DS-451 from Daikin Industry K.K., Megaface F-8151 from DaiNippon Ink & Chemicals K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.3 to 2.0 μm, which is then prebaked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an ArF excimer laser beam in a dose of about 1 to 100 mJ/cm², and preferably about 5 to 50 mJ/cm², then postexposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. The desired pattern may not be obtainable outside the upper and lower limits of the above range.

The resist composition comprising the sulfonium salt of formula (1) is fully sensitive to ArF excimer laser light and has excellent sensitivity and resolution. It can form a relatively thick film which is advantageous to etching. A finely defined pattern having sidewalls perpendicular to the substrate can easily be formed.

EXAMPLE

Examples of the invention are given below by way of illustration and not by way of limitation.

The sulfonium salts (PAG1 to PAG8) of the following formulae were examined with respect to the sensitivity and resolution of resist compositions formulated therewith.

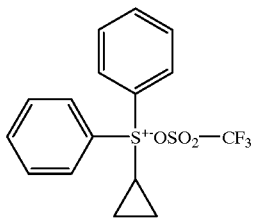

(PAG1)

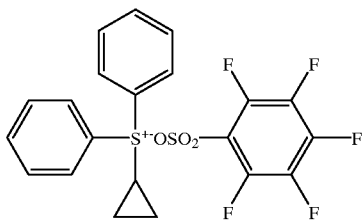

(PAG2)

-continued (PAG3)
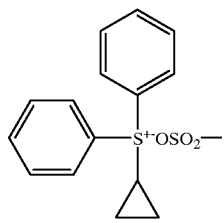

(PAG4)
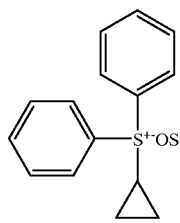

(PAG5)
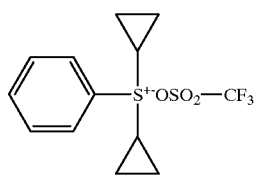

(PAG6)
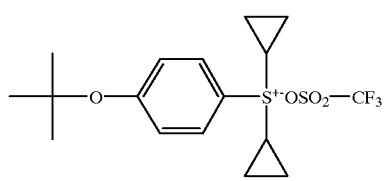

(PAG7)
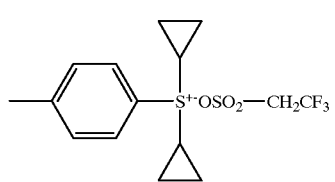

(PAG8)
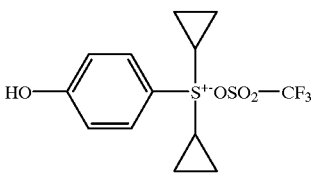

Examples 1–41

Resolution of resist

Resist compositions were formulated by dissolving a sulfonium salt (PAG1 to PAG8) as the photoacid generator, a polymer (Polymers 1 to 8) as the base resin, a dissolution regulator (DRR1 to DRR4), a basic compound, and a compound having a ≡C—COOH group in the molecule (ACC1 and ACC2) in a solvent containing 0.01% by weight of surfactant FC-430 (Sumitomo 3M K.K.) in accordance with the formulation shown in Tables 1 and 2. These compositions were each filtered through a 0.2 μm Teflon filter, thereby giving resist solutions.

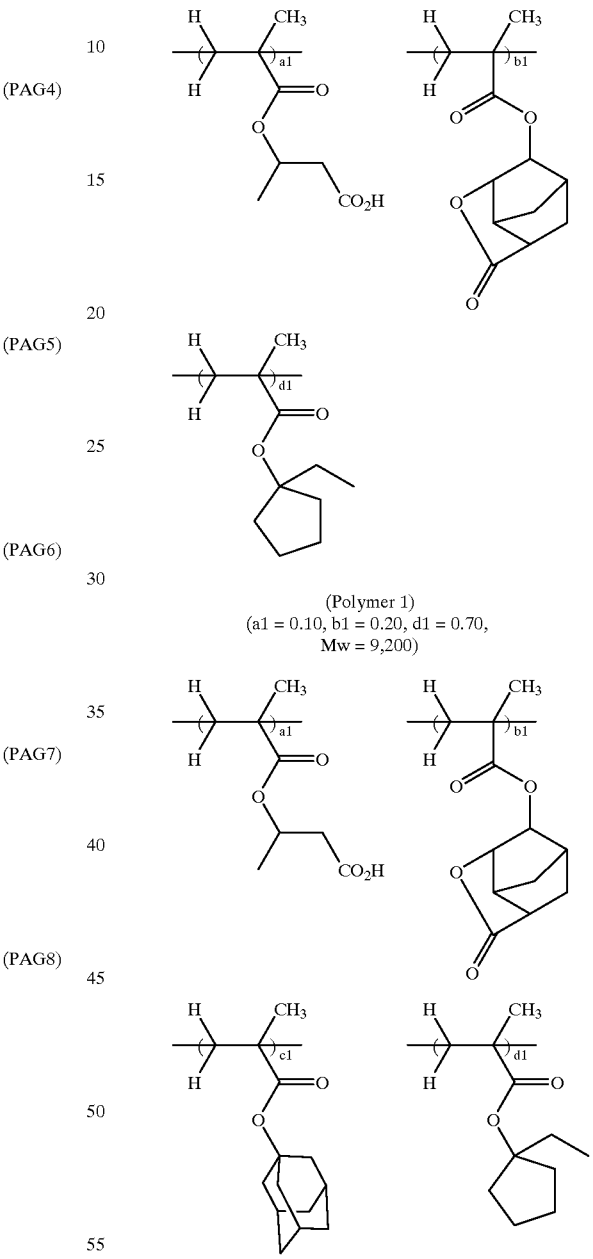

(Polymer 1)
(a1 = 0.10, b1 = 0.20, d1 = 0.70,
Mw = 9,200)

(Polymer 2)
(a1 = 0.10, b1 = 0.20, c1 = 0.30, d1 = 0.40,
Mw = 10,300)

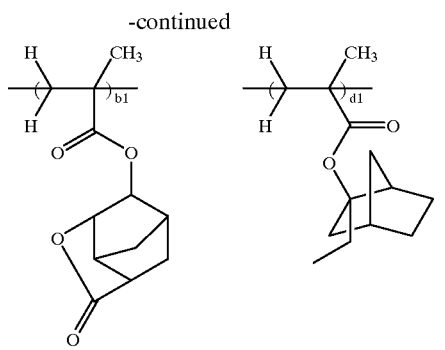
(Polymer 3)
(b1 = 0.50, d1 = 0.50,
Mw = 11,800)
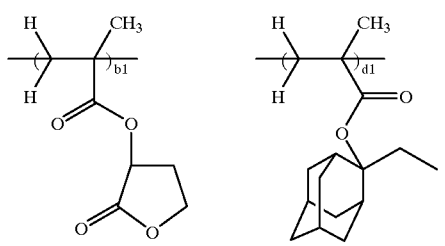
(Polymer 4)
(b1 = 0.40, d1 = 0.60,
Mw = 8,800)
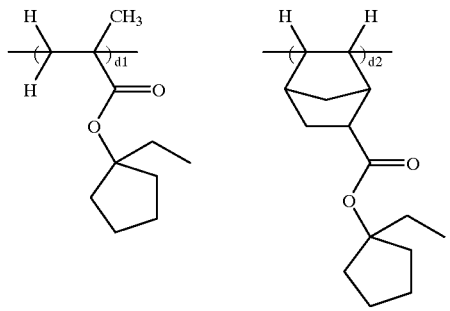
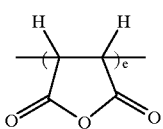
(Polymer 5)
(d1 = 0.30, d2 = 0.35, e = 0.35,
Mw = 10,500)
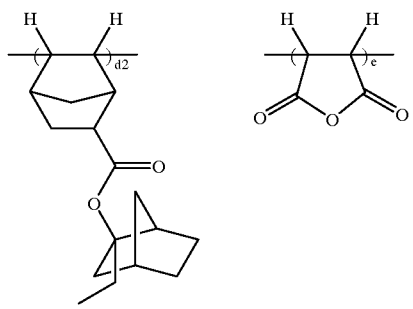
(Polymer 6)
(d2 = 0.50, e = 0.50,
Mw = 8,300)
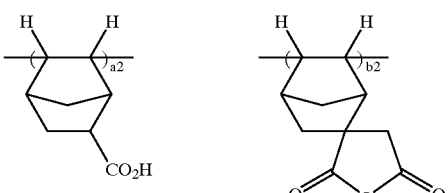
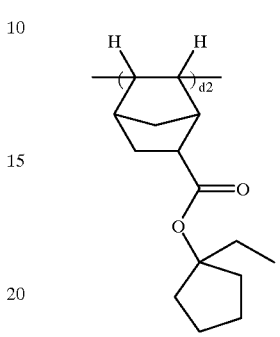
(Polymer 7)
(a2 = 0.10, b2 = 0.30, d2 = 0.60,
Mw = 27,600)
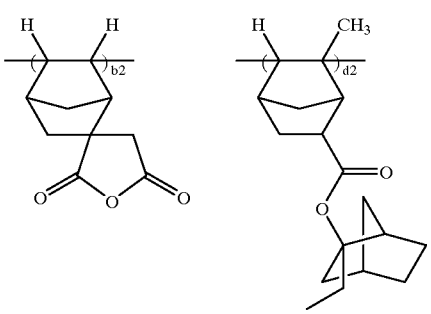
(Polymer 8)
(b2 = 0.40, d2 = 0.60,
Mw = 18,300)
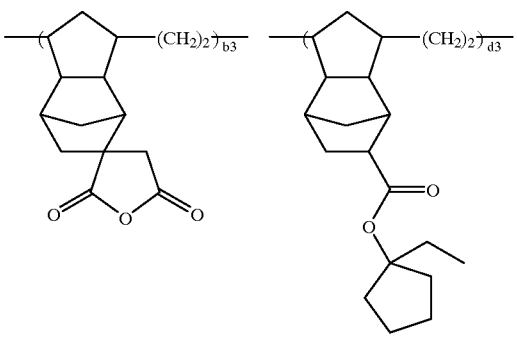
(Polymer 9)
(b3 = 0.40, d3 = 0.60,
Mw = 29,100)
(DRR 1)
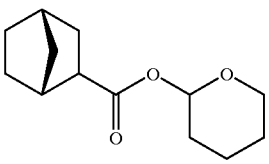

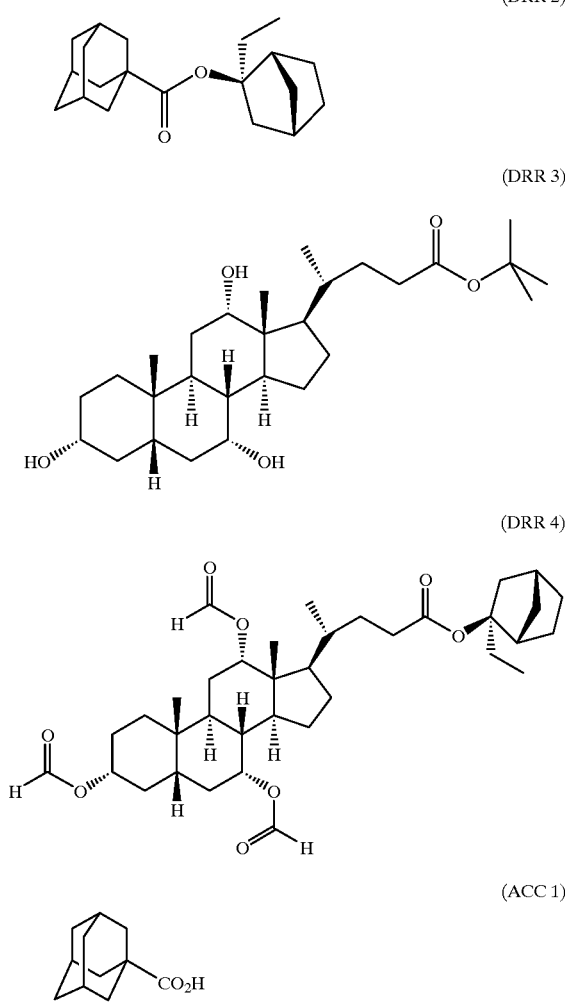

(DRR 2)

(DRR 3)

(DRR 4)

(ACC 1)

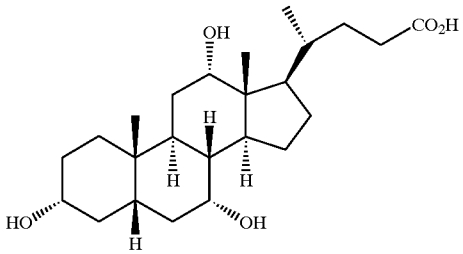

(ACC 2)

The solvents and basic compounds used are as follows.
PGMEA: propylene glycol methyl ether acetate
CyHO: cyclohexanone
PG/EL: a mixture of 70% PGMEA and 30% ethyl lactate
TBA: tributylamine
TEA: triethanolamine
TMMEA: trismethoxymethoxyethylamine
TMEMEA: trismethoxyethoxymethoxyethylamine These resist solutions were spin coated onto silicon wafers, then baked on a hot plate at 110° C. for 90 seconds to give resist films having a thickness of 0.4 μm. The resist films were exposed using an ArF excimer laser aligner (Lithotec Japan K.K.) and an ArF excimer laser stepper (Nikon Corporation; NA 0.55), then baked (PEB) at 110° C. for 90 seconds, and developed with a solution of 2.38% tetramethylammonium hydroxide in water, thereby giving resist patterns.

The resulting resist patterns were evaluated as described below. Provided that the dose which provides a 1:1 resolution at the top and bottom of a 0.25 μm line-and-space pattern is an optimum exposure (Eop, mJ/cm$^2$), i.e., the sensitivity, the resolution of the resist under evaluation was defined as the minimum line width (μm) of the lines and spaces that separated at this dose. The shape of the resolved resist pattern was examined under a scanning electron microscope. It is noted that sensitivity evaluation was made on all the resist compositions using the ArF excimer laser aligner, while resolution was evaluated on some resist compositions using the ArF excimer laser stepper. Also, the resist solutions were held at 23° C. for 2 months before their sensitivity was determined.

The formulation and test results of the respective resist compositions are shown in Tables 1 and 2.

TABLE 1

| Example | Resin | Photoacid generator | Dissolution regulator | Basic compound | Solvent | Sensitivity (fresh) | Resolution (fresh) | Shape (fresh) | Sensitivity (aged) |
|---|---|---|---|---|---|---|---|---|---|
| 1 | Polymer 1 (80) | PAG 1 (1.5) | | TBA (0.10) | PGMEA (480) | 4.5 | 0.18 | rectangular | 4.3 |
| 2 | Polymer 1 (80) | PAG 2 (1.5) | | TBA (0.10) | PGMEA (480) | 5.2 | — | — | 5.3 |
| 3 | Polymer 1 (80) | PAG 3 (1.5) | | TBA (0.10) | PGMEA (480) | 5.6 | 0.18 | rectangular | 5.8 |
| 4 | Polymer 1 (80) | PAG 4 (1.5) | | TBA (0.10) | PGMEA (480) | 4.8 | — | — | 4.8 |
| 5 | Polymer 1 (80) | PAG 5 (2) | | TBA (0.10) | PGMEA (480) | 3.5 | 0.18 | rectangular | 3.6 |
| 6 | Polymer 1 (80) | PAG 6 (2) | | TBA (0.10) | PGMEA (480) | 5.0 | — | — | 5.3 |
| 7 | Polymer 1 (80) | PAG 7 (2) | | TBA (0.10) | PGMEA (480) | 5.2 | 0.18 | rectangular | 5.5 |
| 8 | Polymer 1 (80) | PAG 8 (2) | | TBA (0.10) | PGMEA (480) | 5.5 | — | — | 5.3 |
| 9 | Polymer 1 (80) | PAG 1 (1.5) | | TBA (0.10) | CyHO (560) | 4.6 | 0.18 | rectangular | 4.8 |
| 10 | Polymer 2 (80) | PAG 1 (1.5) | | TBA (0.10) | CyHO (560) | 4.8 | — | — | 4.3 |
| 11 | Polymer 3 | PAG 1 | | TBA | CyHO | 4.3 | 0.18 | rectangular | 4.2 |

TABLE 1-continued

| Example | Resin | Photoacid generator | Dissolution regulator | Basic compound | Solvent | Sensitivity (fresh) | Resolution (fresh) | Shape (fresh) | Sensitivity (aged) |
|---|---|---|---|---|---|---|---|---|---|
|  | (80) | (1.5) |  | (0.10) | (560) |  |  |  |  |
| 12 | Polymer 4 (80) | PAG 1 (1.5) |  | TBA (0.10) | CyHO (560) | 4.8 | — | — | 4.4 |
| 13 | Polymer 5 (80) | PAG 1 (1.5) |  | TBA (0.10) | CyHO (560) | 5.2 | 0.18 | rectangular | 5.0 |
| 14 | Polymer 6 (80) | PAG 1 (1.5) |  | TBA (0.10) | CyHO (560) | 5.5 | — | — | 5.7 |
| 15 | Polymer 7 (80) | PAG 1 (1.5) |  | TBA (0.10) | CyHO (560) | 4.6 | 0.18 | rectangular | 4.8 |
| 16 | Polymer 8 (80) | PAG 1 (1.5) |  | TBA (0.10) | CyHO (560) | 4.8 | — | — | 4.9 |
| 17 | Polymer 9 (80) | PAG 1 (1.5) |  | TBA (0.10) | CyHO (560) | 5.5 | — | — | 5.6 |
| 18 | Polymer 3 (80) | PAG 3 (1.5) |  | TBA (0.10) | CyHO (560) | 5.5 | — | — | 5.9 |
| 19 | Polymer 3 (80) | PAG 3 (1.5) |  | TEA (0.10) | CyHO (560) | 5.8 | — | — | 5.6 |
| 20 | Polymer 3 (80) | PAG 3 (1.5) |  | TMMEA (0.10) | CyHO (560) | 4.8 | — | — | 5.0 |
| 21 | Polymer 3 (80) | PAG 3 (1.5) |  | THEMEA (0.10) | CyHO (560) | 4.0 | — | — | 4.3 |
| 22 | Polymer 6 (80) | PAG 4 (1.5) |  | TEA (0.10) | PG/EL (480) | 5.4 | — | — | 5.2 |
| 23 | Polymer 6 (64) | PAG 4 (1.5) | DRR 1 (16) | TEA (0.10) | PG/EL (480) | 5.0 | — | — | 5.2 |
| 24 | Polymer 6 (64) | PAG 4 (1.5) | DRR 2 (16) | TEA (0.10) | PG/EL (480) | 4.8 | — | — | 4.6 |
| 25 | Polymer 6 (64) | PAG 4 (1.5) | DRR 3 (16) | TEA (0.10) | PG/EL (480) | 4.6 | — | — | 4.6 |

The value in parenthesis shows a blending amount (parts by weight) of each component.

TABLE 2

| Example | Resin | Photoacid generator | Dissolution regulator | Basic compound | Solvent | Sensitivity (fresh) | Resolution (fresh) | Shape (fresh) | Sensitivity (aged) |
|---|---|---|---|---|---|---|---|---|---|
| 26 | Polymer 6 (64) | PAG 4 (1.5) | DRR 4 (16) | TEA (0.10) | PG/EL (480) | 4.8 | — | — | 4.8 |
| 27 | Polymer 7 (80) | PAG 3 (1.5) |  | TEA (0.10) | CyHO (560) | 4.9 | — | — | 5.0 |
| 28 | Polymer 7 (64) | PAG 3 (1.5) | DRR 1 (16) | TEA (0.10) | CyHO (560) | 4.4 | — | — | 4.6 |
| 29 | Polymer 7 (64) | PAG 3 (1.5) | DRR 2 (16) | TEA (0.10) | CyHO (560) | 3.5 | — | — | 3.8 |
| 30 | Polymer 7 (64) | PAG 3 (1.5) | DRR 3 (16) | TEA (0.10) | CyHO (560) | 3.9 | — | — | 4.0 |
| 31 | Polymer 7 (64) | PAG 3 (1.5) | DRR 4 (16) | TEA (0.10) | CyHO (560) | 3.8 | — | — | 4.0 |
| 32 | Polymer 4 (80) | PAG 5 (2) |  | TEA (0.10) | CyHO (560) | 3.8 | — | — | 4.0 |
| 33 | Polymer 4 (80) | PAG 5 (2) | ACC 1 (2) | TEA (0.10) | CyHO (560) | 3.2 | — | — | 3.0 |
| 34 | Polymer 4 (80) | PAG 5 (2) | ACC 2 (2) | TEA (0.10) | CyHO (560) | 3.0 | — | — | 2.9 |
| 35 | Polymer 8 (80) | PAG 6 (2) |  | TEA (0.10) | PGMEA (480) | 5.3 | — | — | 5.0 |
| 36 | Polymer 8 (80) | PAG 6 (2) | ACC 1 (2) | TEA (0.10) | PGMEA (480) | 5.0 | — | — | 4.9 |
| 37 | Polymer 8 (80) | PAG 6 (2) | ACC 2 (2) | TEA (0.10) | PGMEA (480) | 4.9 | — | — | 5.0 |
| 38 | Polymer 3 (40) Polymer 5 (40) | PAG 1 (1.5) |  | TEA (0.10) | PG/EL (480) | 4.8 | — | — | 5.0 |
| 39 | Polymer 3 (40) Polymer 5 (40) | PAG 3 (1.5) |  | TEA (0.10) | PG/EL (480) | 4.9 | — | — | 5.0 |
| 40 | Polymer 5 (40) Polymer 7 (40) | PAG 1 (1.5) |  | TEA (0.10) | CyHO (560) | 4.8 | — | — | 4.6 |
| 41 | Polymer 5 | PAG 3 |  | TEA | CyHO | 3.2 | — | — | 3.8 |

For comparison purposes, the sulfonium salts (PAG9 to PAG19) of the following formulae were examined with respect to the sensitivity and resolution of resist compositions formulated therewith.
(PAG 9)
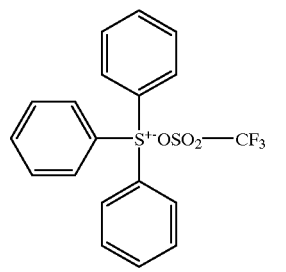
(PAG 10)
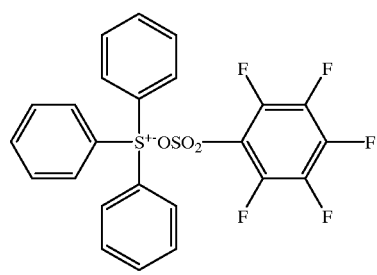
(PAG 11)
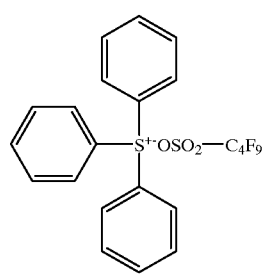
(PAG 12)
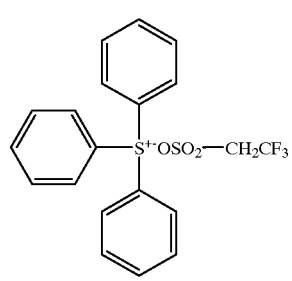
(PAG 13)
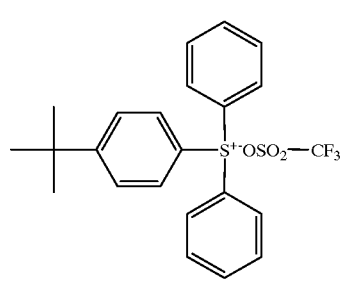
(PAG 14)
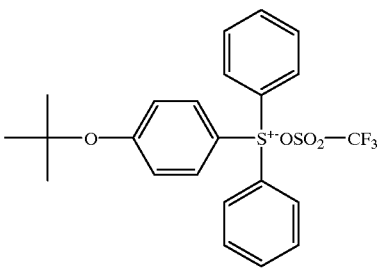
(PAG 15)
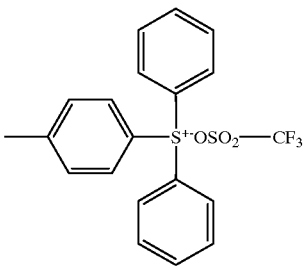
(PAG 16)
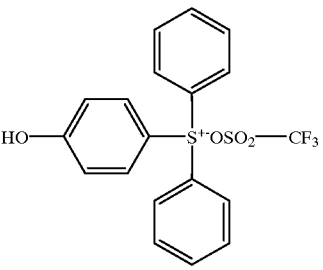
(PAG 17)
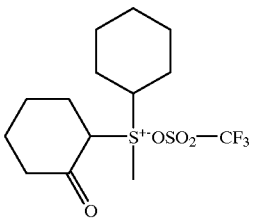
(PAG 18)
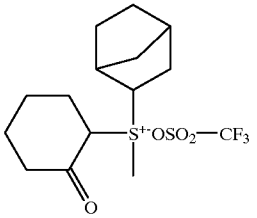
(PAG 19)
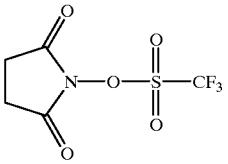

Comparative Examples 1-11

Using the sulfonium salts (PAG9 to PAG19), resist compositions were similarly formulated. They were similarly evaluated for sensitivity and resolution.

The formulation and test results of the respective resist compositions are shown in Table 3.

TABLE 3

| Comparative Example | Resin | Photoacid generator | Dissolution regulator | Basic compound | Solvent | Sensitivity (fresh) | Resolution (fresh) | Shape (fresh) | Sensitivity (aged) |
|---|---|---|---|---|---|---|---|---|---|
| 1 | Polymer 1 (80) | PAG 9 (1) | | TBA (0.10) | PGMEA (480) | 9.1 | 0.18 | rectangular | 9.3 |
| 2 | Polymer 1 (80) | PAG 10 (1) | | TBA (0.10) | PGMEA (480) | 9.9 | — | — | 10.0 |
| 3 | Polymer 1 (80) | PAG 11 (1) | | TBA (0.10) | PGMEA (480) | 9.0 | 0.18 | rectangular | 9.5 |
| 4 | Polymer 1 (80) | PAG 12 (1) | | TBA (0.10) | PGMEA (480) | 9.4 | — | — | 9.6 |
| 5 | Polymer 1 (80) | PAG 13 (1) | | TBA (0.10) | PGMEA (480) | 8.9 | 0.20 | some positive taper | 9.0 |
| 6 | Polymer 1 (80) | PAG 14 (1) | | TBA (0.10) | PGMEA (480) | 9.2 | — | — | 8.8 |
| 7 | Polymer 1 (80) | PAG 15 (1) | | TBA (0.10) | PGMEA (480) | 8.5 | 0.20 | some positive taper | 8.3 |
| 8 | Polymer 1 (80) | PAG 16 (1) | | TBA (0.10) | PGMEA (480) | 9.2 | — | — | 8.9 |
| 9 | Polymer 1 (80) | PAG 17 (1) | | TBA (0.10) | PGMEA (480) | 5.5 | — | — | 0.5 |
| 10 | Polymer 1 (80) | PAG 18 (1) | | TBA (0.10) | PGMEA (480) | 4.8 | — | — | 0.3 |
| 11 | Polymer 1 (80) | PAG 19 (1) | | TBA (0.10) | PGMEA (480) | 4.6 | — | — | 0.1 |

The value in parenthesis shows a blending amount (parts by weight) of each component.

As seen from Tables 1 to 3, the resist compositions falling within the scope of the invention have a higher sensitivity, resolution and storage stability than the prior art compositions.

Japanese Patent Application No. 2000-077496 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising a base resin, a photoacid generator, and a solvent, wherein the photoacid generator is a sulfonium salt of the following general formula (1):

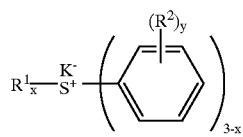

(1)

wherein $R^1$ is a monovalent cyclic or bridged-ring hydrocarbon group of 3 to 20 carbon atoms, $R^2$ is hydroxyl, nitro, halogen, or a straight, branched or cyclic monovalent hydrocarbon group of 1 to 15 carbon atoms which optionally contains an oxygen, nitrogen, sulfur or halogen atom, $K^-$ is a non-nucleophilic counter ion, x is equal to 1 or 2, and y is an integer of 0 to 3.

2. The resist composition of claim 1 wherein the base resin is a polymer having an alicyclic structure.

3. A resist composition comprising a base resin, a photoacid generator, and a solvent, wherein the photoacid generator is a sulfonium salt of the following general formula (1):

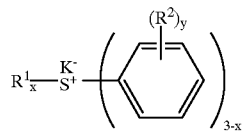

(1)

wherein $R^1$ is a monovalent cyclic or bridged-ring hydrocarbon group of 3 to 20 carbon atoms, $R^2$ is hydroxyl, nitro, halogen, or a straight, branched or cyclic monovalent hydrocarbon group of 1 to 15 carbon atoms which optionally contains an oxygen, nitrogen, sulfur or halogen atom, $K^-$ is a non-nucleophilic counter ion, x is equal to 1 or 2, and y is an integer of 0 to 3, and wherein the base resin is at least one polymer selected from the group consisting of polyacrylic acid and derivative thereof, a tertiary or quaternary copolymer of a norbornene derivative-maleic anhydride alternating polymer and polyacrylic acid and a derivative thereof, a tertiary or quaternary copolymer of a tetracyclododecene derivative-maleic anhydride alternating polymer and polyacrylic acid and a derivative thereof, a tertiary or quaternary copolymer of a norbornene derivative-maleimide alternating polymer and polyacrylic acid and a derivative thereof, a tertiary or quaternary copolymer of a tetracyclododecene derivative-maleimide alternating polymer and polyacrylic acid and a derivative thereof, polynorbornene, and a metathesis ring-opened polymer.

4. A resist composition according to claim 3, wherein y is an integer of 0 or 1.

5. A resist composition comprising a base resin, a photoacid generator, and a solvent, wherein the photoacid generator is a sulfonium salt of the following general formula (1):

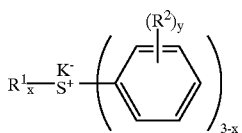 (1)

wherein $R^1$ is a monovalent cyclic or bridged-ring hydrocarbon group of 3 to 20 carbon atoms, $R^2$ is hydroxyl, nitro, halogen, or a straight, branched or cyclic monovalent hydrocarbon group of 1 to 15 carbon atoms which optionally contains an oxygen, nitrogen, sulfur or halogen atom, $K^-$ is a non-nucleophilic counter ion, x is equal to 1 or 2, and y is an integer of 0 to 3, and wherein the base resin is a polymer comprising recurring units of the following general formula (2) and having a weight average molecular weight of 1,000 to 500,000,

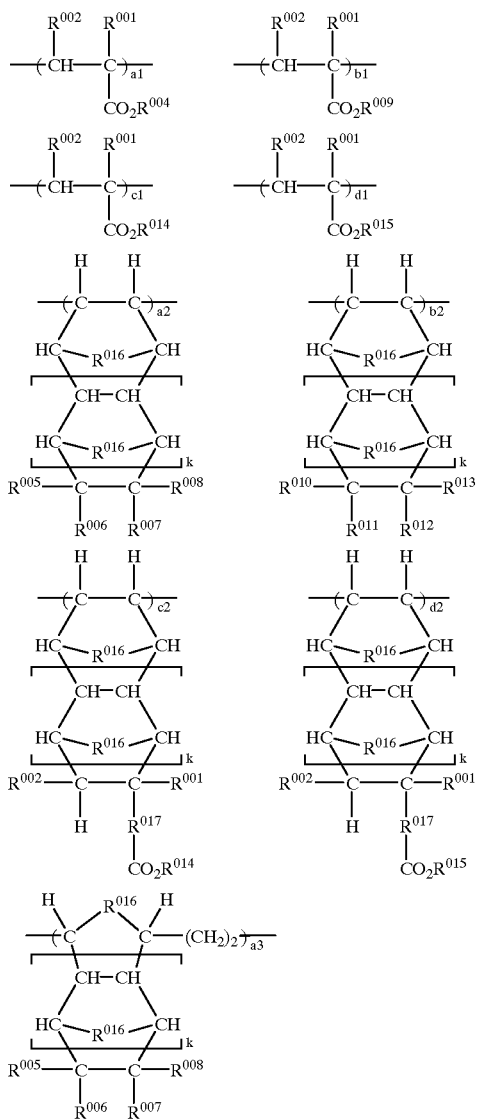 (2)

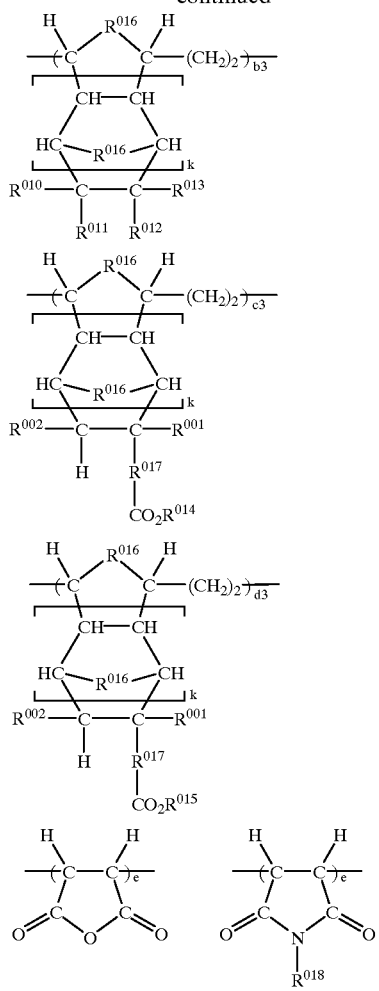

wherein $R^{001}$ is hydrogen, methyl or $CH_2CO_2R^{003}$; $R^{002}$ is hydrogen, methyl or $CO_2R^{003}$; $R^{003}$ is a straight, branched or cyclic alkyl group of 1 to 15 carbon atoms; $R^{004}$ is hydrogen or a monovalent hydrocarbon group of 1 to 15 carbon atoms having a carboxyl or hydroxyl group; at least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms, $R^{005}$ to $R^{008}$, taken together, optionally form a ring, and in that event, at least one of $R^{005}$ to $R^{008}$ is a divalent hydrocarbon group of 1 to 15 carbon atoms having a carboxyl or hydroxyl group while the remaining R's are independently single bonds or straight, branched or cyclic alkylene groups of 1 to 15 carbon atoms; $R^{009}$ is a monovalent hydrocarbon group of 3 to 15 carbon atoms containing a —$CO_2$— partial structure; at least one of $R^{010}$ to $R^{013}$ is a monovalent hydrocarbon group of 2 to 15 carbon atoms containing a —$CO_2$— partial structure, while the remaining R's are independently hydrogen or straight, branched or cyclic alkyl groups of 1 to 15 carbon atoms, $R^{010}$ to $R^{013}$, taken together, optionally form a ring, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic alkylene groups of 1 to 15 carbon atoms; $R^{014}$ is a polyclic hydrocarbon group having 7 to 15 carbon atoms or an alkyl group containing a polycyclic hydrocarbon group; $R^{015}$ is an acid labile group; $R^{016}$ is a methylene group or oxygen atom; $R^{017}$ is a single bond or a straight, branched or cyclic alkylene group of 1 to 10 carbon atoms which optionally has a hetero atom-containing substituent; $R^{018}$ is hydrogen or an alkyl group of 1 to 10 carbon atoms; k is equal to 0 or 1; a1, a2, a3, b1, b2, b3, c1, c2, c3, d1, d2, d3, and e are numbers from 0 to less than 1, satisfying a1+a2+a3+b1+b2+b3+c1+c2+c3+d1+d2+ d3+e=1.

6. A resist composition according to claim 5, wherein y is an integer of 0 or 1.

7. A resist composition according to claim 5, wherein the polymer has a weight average molecular weight of 5,000 to 100,000.

8. A chemically amplified, positive resist composition comprising a photoacid generator of the general formula (1),

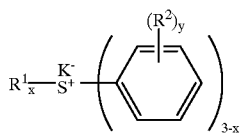

a base resin according to claim 2 which is substantially insoluble in a developer, but becomes soluble in the developer under the action of an acid, and a solvent.

9. The resist composition of claim 8 further comprising a basic compound.

10. A resist composition according to claim 1, wherein y is an integer of 0 or 1.

11. A resist composition according to claim 1, wherein the photoacid generator is selected from the group consisting of

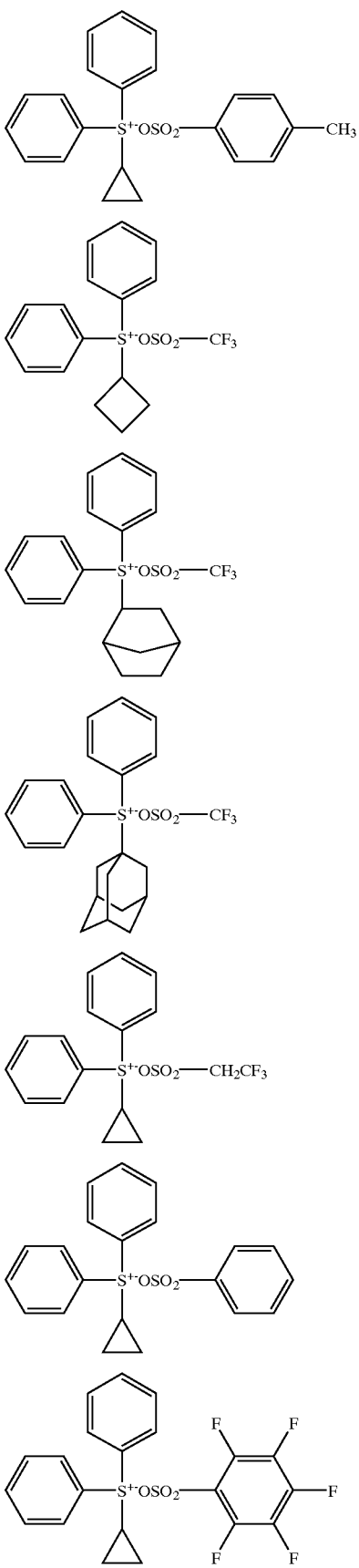

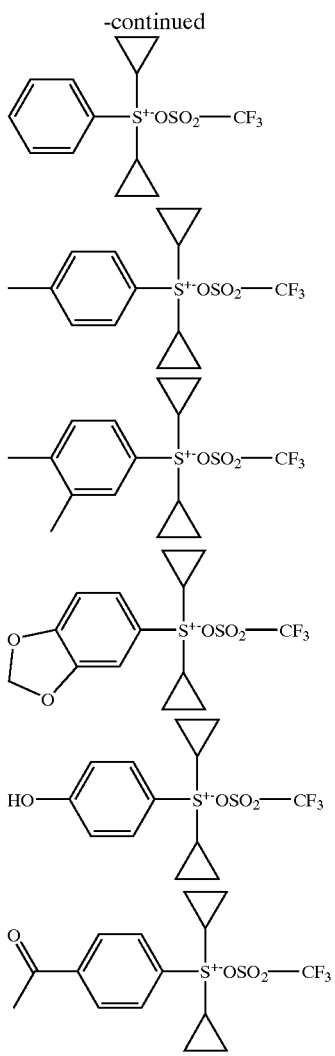

12. A chemically amplified, negative resist composition comprising
a photoacid generator of the general formula (1),

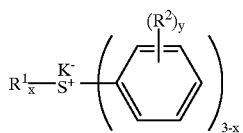

(1)

a crosslinker,
a base resin according to claim 2 which is soluble in a developer, but becomes insoluble in the developer after being crosslinked with the crosslinker under the action of an acid, and
a solvent.

13. The resist composition of claim 12 further comprising a basic compound.

14. A process for forming a resist pattern comprising the steps of:
applying a resist composition according to claim 1 onto a substrate to form a coating,
heat treating the coating and then exposing it to radiation having a wavelength of up to 200 nm through a photo mask, and
optionally heat treating the exposed coating and developing it with a developer.

15. A chemically amplified, positive resist composition comprising
a photoacid generator of the general formula (1),

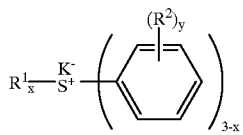

(1)

a base resin according to claim 3 which is substantially insoluble in a developer, but becomes soluble in the developer under the action of an acid, and
a solvent.

16. A chemically amplified, negative resist composition comprising
a photoacid generator of the general formula (1),

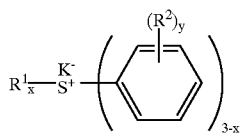

(1)

a crosslinker,
a base resin according to claim 3 which is soluble in a developer, but becomes insoluble in the developer after being crosslinked with the crosslinker under the action of an acid, and
a solvent.

17. A chemically amplified, positive resist composition comprising
a photoacid generator of the general formula (1),

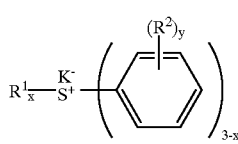

(1)

a base resin according to claim 5 which is substantially insoluble in a developer, but becomes soluble in the developer under the action of an acid, and
a solvent.

18. A chemically amplified, negative resist composition comprising
a photoacid generator of the general formula (1),

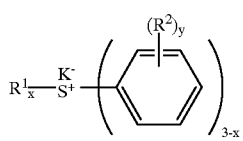

(1)

a crosslinker,
a base resin according to claim 5 which is soluble in a developer, but becomes insoluble in the developer after being crosslinked with the crosslinker under the action of an acid, and a solvent.

* * * * *